United States Patent [19]

Shinohara et al.

[11] Patent Number: 5,448,098
[45] Date of Patent: Sep. 5, 1995

[54] SUPERCONDUCTIVE PHOTOELECTRIC SWITCH

[75] Inventors: Koji Shinohara, Atsugi; Osamu Ohtsuki, Kawasaki; Kazuo Murase, Toyonaka; Sadao Takaoka, Kobe, all of Japan

[73] Assignee: Fujitsu Limited, Kawasaki, Japan

[21] Appl. No.: 934,306

[22] Filed: Aug. 25, 1992

Related U.S. Application Data

[63] Continuation of Ser. No. 666,711, Mar. 8, 1991, abandoned.

[30] Foreign Application Priority Data

Mar. 14, 1990 [JP] Japan ................................. 2-64551

[51] Int. Cl.$^6$ ............................................ H01L 27/14
[52] U.S. Cl. .................................. 257/441; 257/37; 257/442; 257/608; 505/848; 250/336.2
[58] Field of Search ................... 357/5, 4; 257/35, 37, 257/441, 609, 612, 442; 250/336.2; 505/848, 849

[56] References Cited

U.S. PATENT DOCUMENTS

| | | | |
|---|---|---|---|
| 4,837,609 | 6/1989 | Gurvitch et al. | 357/71 |
| 4,843,446 | 6/1989 | Nishino et al. | 357/5 |
| 4,970,395 | 11/1990 | Kruse, Jr. | 357/5 |
| 4,990,487 | 2/1991 | Masumi | 357/5 |
| 5,057,485 | 10/1991 | Nishino et al. | 257/37 |

OTHER PUBLICATIONS

Tsuboi, "Photosensitive Tunnel Junctions And Photosensitive Granular Films with Te or Se Barriers," *Physics Letters*, vol. 56A, No. 6, May 1976, pp. 472–474.

Physics Letters, vol. 71A, No. 5, 6, 28 May 1979, Amsterdam NL pages 471–472; G. Deutscher et al.: "A granular photosuperconductor" *the whole document*.

Japanese Journal of Applied Physics, Supplements, vol. 26-3, 1987, Tokyo JA, pp. 1345–1346; S. Takaoka et al.: "Superconductivity of (Pb, Sn, Ge) Te semiconductor film with a little Pb inclusion" *the whole document*.

Soviet Physics Semiconductors, vol. 17, No. 12, Dec. 1983, New York, US, pp. 1396–1399; I. I. Zasavitskil et al.: "Kinetics of the photoconductivity of PbSnTe:In" *the whole document*.

Physical Review Letters, vol. 20, No. 23, 03 Jun. 1968, New York, US, pp. 1286–1289; I. Giaever: "Photosensitive tunneling and superconductivity" *the whole document*.

Hitachi Review, vol. 39, No. 1, Feb. 1990, Tokyo JP, pp. 35–40; T. Nishino et al.: "The field-effect superconducting transistor" *the whole document*.

Patent Abstracts of Japan, vol. 13, No. 44 (E–710) 31 Jan. 1989, & JP-A-63 239877 (Sumitomo) 05 Oct. 1988, *the whole document*.

Solid State Communications, vol. 76, No. 1, Jul. 1990, Oxford GB, pp. 31–34; T. Koshindo et al.: "Enhancement of superconducting transition temperature by photo-carriers in indium doped PbSnTe film with lead inclusion" *the whole document*.

*Primary Examiner*—Sara W. Crane
*Assistant Examiner*—Courtney A. Bowers
*Attorney, Agent, or Firm*—Staas & Halsey

[57] ABSTRACT

A first type of superconductive photoelectric device is provided by a superconductive thin film located between two electrodes. The superconductive thin film is one which has a photo-conductive effect and converts from a normally conducting state to a superconductive state in response to light irradiation. The superconductive thin film is preferably formed of a compound semiconductor of Pb chalcogenide added with Pb and/or In added beyond the stoicheometry of the compound semiconductor, such as $Pb_{1-x}Sn_xTe+In$, so as to generate precipitations of Pb. A second type of superconductive photoelectric device is provided by a photoconductive material formed of $Pb_{1-x}Sb_xTe$ filled in a gap between two superconductive electrodes, where the gap width is shorter than 500 times of a coherence length. In either the first-or second type, when an infrared light is irradiated onto the photo-conductive region at a predetermined temperature, the coherence length of the superconductivity is extended so as to convert from a normally conducting state to a superconductive state. When ON/OFF irradiated with a light shorter than 0.8 μm, a material $Pb_{1-x}Sn_xTe$ without In switches between the normally conducting state and the superconductive state. With In added, the material persistently converts from the normally conducting state to the superconductive state.

23 Claims, 4 Drawing Sheets

S : SUPERCONDUCTIVE
N : NORMALLY CONDUCTING

SUPERCONDUCTIVE PHOTOELECTRIC SWITCH This application is a continuation of application No. 07/666,711, filed Mar. 8, 1991, now abandoned.

BACKGROUND OF THE INVENTION

1. Field of the Invention

The present invention relates to a functional photoelectric device utilizing a superconducting transition temperature enhancement effect caused by a light irradiation thereto. More particularly, it relates to a superconducting photoelectric device which can be employed as a high speed light switch device, a photo detector or a light memory device.

2. Description of the Related Arts

In recent years, higher speed computer systems have required higher speed switching devices and memory devices have been required. As a high speed device to meet these requirements, there has been developed a superconductive transistor employing a Josephson junction. Switching operation of this transistor is carried out by electrically injecting electrons or positive holes into a semiconductor region located between superconductive regions. Accordingly, it takes some time for the electrons or the positive holes to be injected thereto, resulting in a limit of its speed. Moreover, there has been proposed a superconductive photo-transistor which switches between its superconductive state and its normally conducting state in response to light irradiation, such as disclosed in Japanese Unexamined Patent Publication 64-65884 or 63-239877. However, there has never been accomplished yet a superconductive device which switches from a normally conducting state to a superconductive state in response to a light irradiation. This is logically reverse to that of the prior art device.

SUMMARY OF THE INVENTION

It is a general object of the invention, therefore, to provide a new functional superconductive photoelectric device utilizing a rise in superconducting transition temperature caused by photo-carriers.

It is another object of the invention to provide a high speed superconductive photo-switch of a simple structure which switches between normally conductive state and its superconductive state by a light irradiation.

It is still another object of the invention to provide a new functional superconductive photoelectric device which can be employed as a photo detector or a memory device.

A functional superconductive photoelectric device according to the present invention is constituted mainly with a compound semiconductor comprising lead chalcogenide doped with lead or indium. When an infrared light is irradiated onto the thus composed semiconductor, particularly a thin film of $Pb_{1-x}Sn_xTe$ doped with lead, where Pb indicates lead, Sn indicates tin and Te indicates tellurium, a phenomenon can be observed that there is a rise in its superconductive transition temperature. The present invention utilizes this phenomenon so as to accomplish a new functional device which can switch from its normally conducting state to its superconductive state by a light irradiation thereto.

According to a first mode of the invention, the new functional superconductive photoelectric device, constituted with a superconductive thin film having a photo-conductive effect located between two electrodes, and converting from a normally conducting state to a superconductive state in response to light irradiation, is characterized in that the superconductive thin film is formed of a compound semiconductor of lead chalcogenide doped with lead (Pb) and/or Indium (In).

Moreover, in a second mode of the invention, the new functional superconductive photoelectric device, constituted with an photo-conductive region in contact with plural superconductive regions, is characterized in that a gap, filled with the photo-conductive region, between the plural superconductive regions is shorter than 500 times the coherence length of the superconductivity, wherein upon a light irradiation thereto at a predetermined temperature the coherence length of the superconductivity in the photo-conductive region is extended so as to generate superconductive characteristics therein.

The above-mentioned features and advantages of the present invention, together with other objects and advantages, which will become apparent, will be more fully described hereinafter, with reference being made to the accompanying drawings which form a part thereof, wherein like numerals refer to like parts throughout.

A BRIEF DESCRIPTION OF THE DRAWINGS

FIGS. 1(a) and (b) schematically illustrate an operation principle of the functional superconductive photoelectric device according to the present invention;

Figure 5:
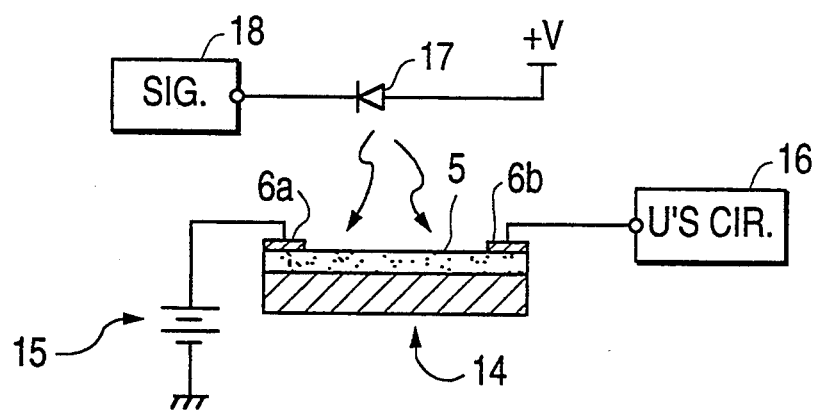
FIG. 5 shows a principle circuit diagram employing the device of the present invention in its switching circuit.
Figure 6A:
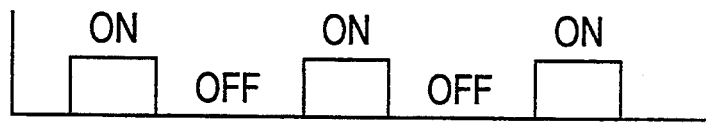
Figure 6B:
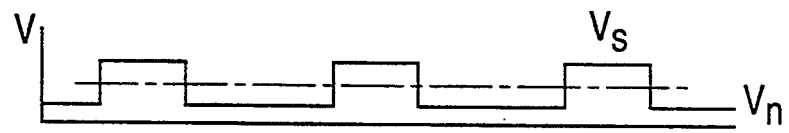

FIGS. 6(a) and 6(b) show input-output waveforms in FIG. 5 circuit; and

Figure 7:
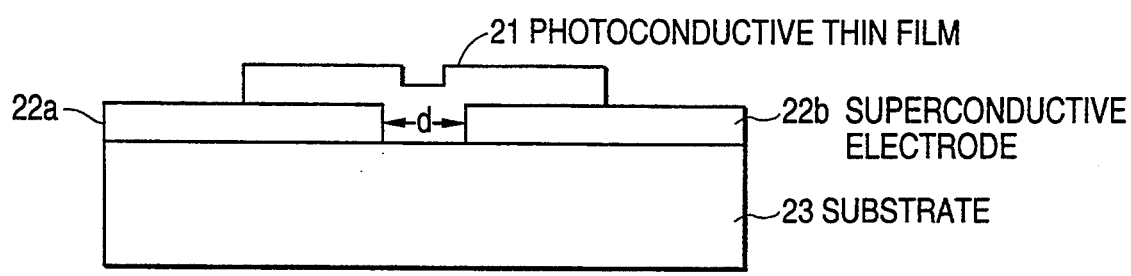
Figure 8:
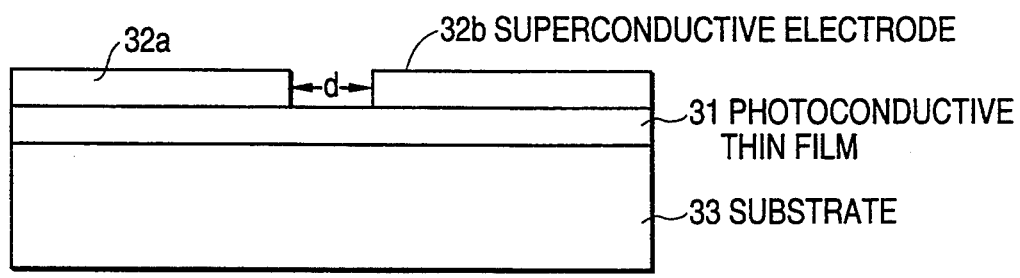

FIGS. 7 and 8 show cross-sectional views of other functional devices of the present invention.

DESCRIPTION OF THE PREFERRED EMBODIMENTS

The present invention is based on a principle that in a photo-conductive material filled in a gap between closely located superconductive regions, a light irradiation thereto causes coherence length of the superconductivity to extend so that the photo-conductive gap is bridged by the superconductive regions. In this principle, grains of the lead doped in the compound semiconductor of PbSnTe function as a superconductive material and the PbSnTe semiconductor functions as a photo-conductive material.

Figure 1A:
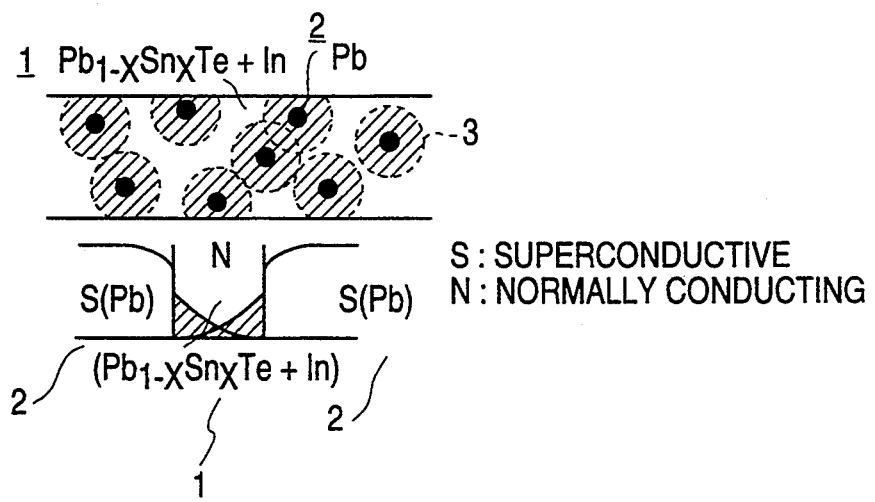
Figure 1B:
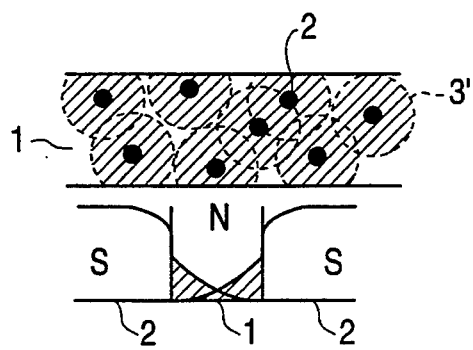

FIGS. 1(a) and (b) show a model of the principle of the above-described function. In the FIG. 1(a) structure, grains, i.e. precipitations, of the doped Pb are spatially distributed like stepping stones in a thin film 1 formed of $Pb_{1-x}Sn_xTe$ or $Pb_{1-x}Sn_xTe+In$ semiconductor. In a normally conducting state where no light is irradiated onto the compound semiconductor thin film 1, superconducting region of the Pb grains pass over Josephson junction between the Pb grains and $Pb_{1-x}Sn_xTe+In$ semiconductor, so as to penetrate into the semiconductor region 1 as indicated with shaded area 3. Then, however, the coherence length of the superconductivity is not long enough to connect the Pb grains by the superconductive regions. On the other hand, when a light is irradiated onto compound semiconductor thin film 1, photo carriers generated in the $Pb_{1-x}Sn_xTe/In$ semiconductor cause an extension of the coherence length of the superconductivity from each of the Pb grains. Consequently, the shaded areas indicating the superconducting state expand so as to be continuous with each other as shown in FIG. 1(b), so that the whole compound semiconductor thin film 1 becomes superconductive. If In is doped into the $Pb_{1-x}Sn_xTe$ semiconductor to replace the Pb grain, or supplimentarily added thereto, the In grain forms a deep level so that the superconductivity is kept on even after the light irradiation is discontinued. Accordingly, the thus provided persistent superconductivity can provide a photo memory device.

Figure 2:
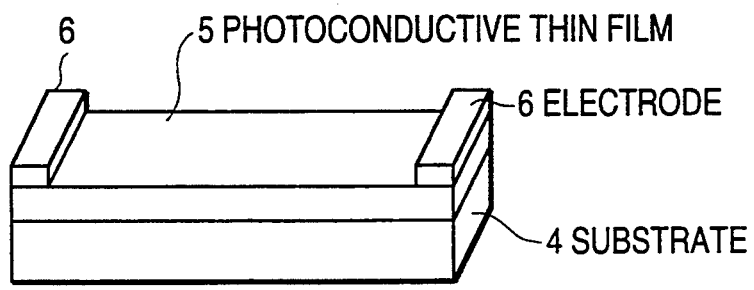
FIG. 2 is a perspective view of an example of a structure of the functional superconductive photoelectric device according to the present invention.

FIG. 2 shows an example of a practical structure of the functional superconductive photoelectric device according to the present invention. A substrate 4 is formed of barium-fluoride ($BaF_2$) measuring 1 mm×5 mm, for example. Other materials, such as magnesium oxide (MgO), semi-insulative gallium-arsenide (GaAs) or silicon (Si), can be employed for the substrate material, in place of the $BaF_2$. At first, a photo-conductive ternary semiconductor, such as $Pb_{1-x}Sn_xTe$, as a superconductive thin film 5, is deposited upon substrate 4 typically as thick as 1 $\mu$m by a hot wall method. Next, electrodes 6a and 6b typically formed of gold (Au) or indium (In) are provided on both the ends of compound semiconductor thin film 5. Thus, a functional superconductive photoelectric device is fabricated. Other methods, such as vacuum deposition, liquid phase epitaxial growth, molecular beam epitaxy (MBE) or metal organic chemical vapor deposition (MOCVD), may be employed for fabricating the compound semiconductor thin film 5 instead of the hot wall method.

According to measurements, by present inventors, of the switch function and the memory function of the thus fabricated functional superconductive photoelectric device where a constant current source (not shown in the figures) is connected to electrodes 6a and 6b as well as a light is irradiated onto the photo-conductive thin film 5 at very low temperatures, temperature dependence of resistivity of the photo-conductive thin film 5 is obtained as hereinafter described.

Figure 3:
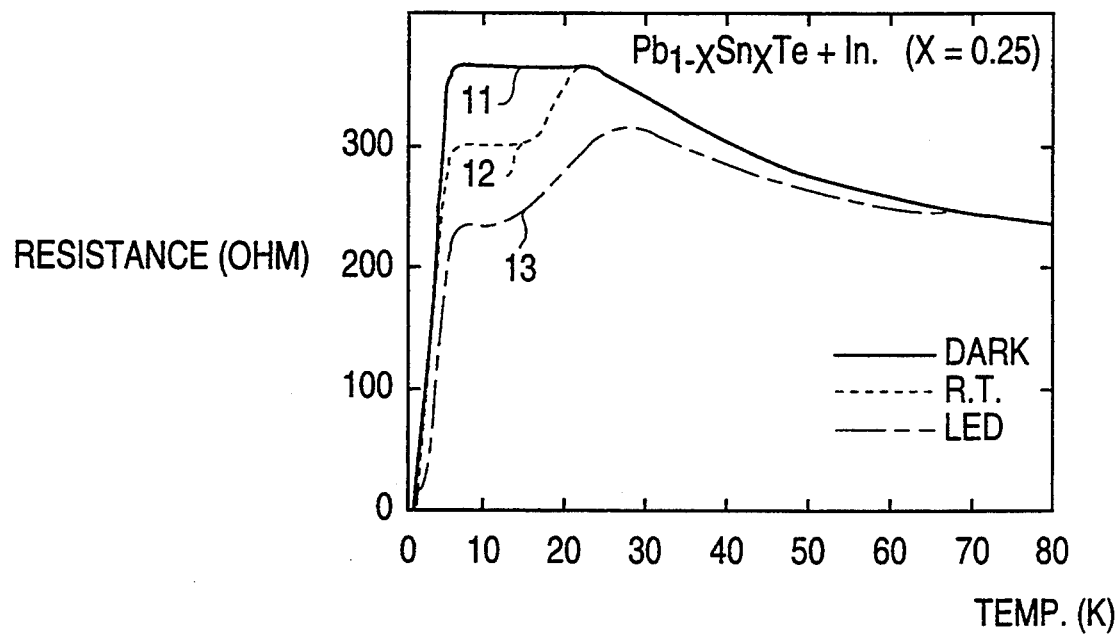
FIG. 3 is a graph showing characteristic curves of the FIG. 2 device.
Figure 4:
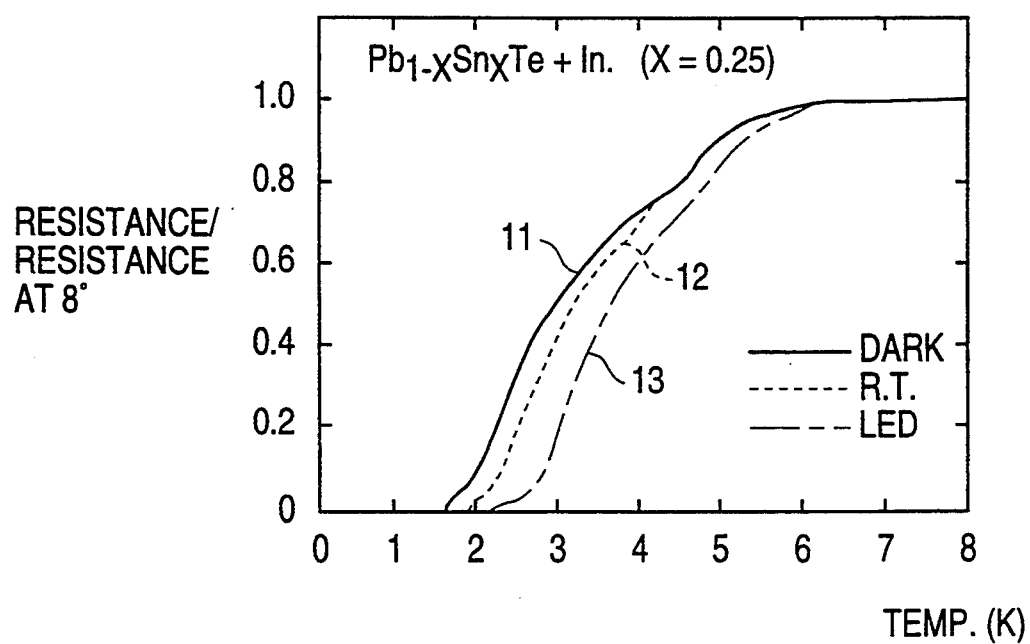
FIG. 4 is a graph showing low temperature part of the FIG. 3 characteristic curves, in an expanded scale.

The characteristics were measured with a sample employing $Pb_{0.75}Sn_{0.25}Te+In$, where the ratio of PbSn:Te is 51:49 and the In content is 1% of PbSn, for photo-conductive thin film 5; thus, the Pb content is beyond the stoichiometry, PbSn:Te=50:50. The measured data is shown in FIG. 3, where the ordinate indicates the resistance value in ohm and the abscissa indicates the device temperature in degree K. FIG. 4 shows very low temperature part of FIG. 3 curves in an expanded scale in order to provide easier comprehension of the lower temperature characteristics, where the ordinate is normalized by the resistance value at 8 degree K. In the figures, the solid line indicates dark state characteristic, when no light is irradiated thereto; the dotted line indicates the characteristics when an infrared light of wavelength spectrum having the peak at approximately 10 $\mu$m wave length is irradiated thereto from a 300 degrees K. (i.e. room temperature) black body; and the chain line indicates the characteristic when a 1 $\mu$m wavelength infrared light of 10 $\mu$W/cm$^2$ strength is irradiated from a GaAs LED (light emitting diode) onto the photo-conductive thin film 5. As observed in FIG. 4, the electrical resistance value of the above-described devices falls off at the temperature below 8 degrees K. by an infrared light irradiation thereto, as well as the superconducting transition temperature $T_c$ shifts towards higher temperature, that is, the superconducting state is realized at a higher temperature. For example, at the device temperature 2 degrees K., photo-conductive thin film 5 is in a normally conductive state in the dark state as indicated by curve 11; however, under an infrared light irradiation thereto from an LED, photo-conductive thin film 5 becomes superconductive having zero resistance value as indicated by curve 13, where it is observed that the resistance value shifts as much as range $R_{off}$. At 3 degrees K., under the infrared light irradiation it is observed that the resistance value falls off by a little over 50% as shown by range $R_{off}'$.

This phenomena is explained in the same way as that of FIG. 1, as follows. In the compound semiconductor as a superconductive thin film, each of precipitations of the doped impurities (Pb), or grains born from the precipitations, forms a Josephson junction with the semiconductor material, where electrons in the semiconductor material are excited by the light irradiation thereto so as to rapidly increase the carrier concentration, which then causes the extension of the coherence length of the superconductivity from the Pb grains so that the coherence length reaches the same degree as the thickness of the barrier of the Josephson junction. Consequently, it is supposed that the whole semiconductor region becomes superconductive. Though it is observed that an approximately 2% addition of Pb by weight is effective to enhance the superconducting transition temperature under the light irradiation, an addition of 1 to several percents of Pb also provides good results.

Moreover, in the above-cited compound semiconductor the carrier concentration does not decrease but keeps a superconducting state even after the light irradiation from the LED is discontinued. This is supposed to be due to the contribution of the added In as an impurity. Accordingly, this compound semiconductor possessing a persistent photo-conductivity characteristic can be employed as a light memory device.

When a shorter wavelength light than 0.8 $\mu$m is irradiated onto above-cited $Pb_{1-x}Sn_xTe$ semiconductor without In addition, the material does not exhibit the persistently superconductive characteristic. Accordingly, the material can be employed as a switching device between the normally conducting state and the superconducting state in response to the existence of the light irradiation thereto.

FIG. 5 shows a basic circuit configuration employing the above-described functional photoelectric device as an optical switch. An electrode 6a at a one side of device 14 shown above in FIG. 2 is connected to a power source 15. An electrode 6b at the other side of device 14 is connected as an output terminal to a high impedance user's circuit 16.

Functional photoelectric device 14 Is mounted in a cooling dewer (not shown in the figure), shielded from light irradiation and kept at a predetermined temperature between 2 to 4 degrees K. An infrared light LED 17 is placed to face photo-conductive thin film 5, for inputting a signal light thereto. According to ON/OFF-switching of the LED, the resistance value of the photo-conductive thin film 5 varies so as to generate a high speed ON/OFF-switched signal in the high impedance user's circuit 16. LED 17 may be replaced with an output end of an optical fiber transmission line connected to a distant signal source. More practically, a plurality of light switch devices 14 can be combined so as to constitute a light logic circuit common for the high impedance user's circuit 16.

An input-ouput characteristic of the light switch device 14 is shown in FIGS. 6, where in response to the input signal (i.e. the ON/OFF of the signal light) shown in FIG. 6(a) from signal source 18 an output signal shown in FIG. 6 (b) appears at output terminal 66 of the device 14. At an input light signal OFF-state, the photoconductive thin film 5 being at a normally conducting state keeps the output signal at $V_n$ level; on the contrary, at an input light signal ON-state, the photo-conductive thin film 5 being converted to a superconductive state makes the output terminal rapidly rise to a superconductive level $V_s$ which is close to the power source voltage. Therefore, a threshold level $V_{th}$ provided in advance in the user's circuit, between these two voltages, allows detection of the output signal component.

As is apparent from the principle described above, the present invention utilizes a proximity effect caused from the light excitation of the superconductive grains (Pb or In) added in the photo-conductive semiconductor. Therefore, the material having the photo-conductive effect is not limited only to the above-recited PbSnTe; but also other semi-insulative materials (having a low carrier concentration), in which high carrier mobility as well as long life time of the carrier are accomplished, can provide a similar functional photoelectric device based on the same principle. Compound semiconductors, such as the above-recited $Pb_{1-x}Sn_xTe$ as well as other lead chalcogenides, such as PbCdTe (lead-cadmium-tellurium), PbTe (lead-sulphor-tellurium) or PbSSe (lead-sulphor-selenium), possess a narrow bandgap as well as a high carrier mobility, therefore, are suitable for a device which rapidly respond particularly to an infrared light.

A III-V group high resistance material in which the high resistivity is accomplished with GaAs doped with chrome (Cr), highly purified GaAs, or indium-phosphorus (InP) doped with iron (Fe) may be employed as the switching device by being added with the superconductive grains. A II-VI group compound semiconductor, such as cadnium-tellurium (CdTe), mercury-cadnium-tellurium (HgCdTe) or cadmium-sulphur (CdS) may also alternatively employed thereto. Even in the above-cited case where GaAs or InP is employed, the persistently conductive photo-conductivity can be accomplished by introducing a DX center thereto.

The above-described photo-conductive superconductive thin film can be considered that Josephson junctions are formed between the semiconductor base material and each of the countless superconductive grains. Therefore, even if the above-cited superconductive grains do not exist, a functional photoelectric device having the same function can be accomplished based on the same principle, when a particular structure of the superconductive electrodes is employed as described below. FIG. 7 shows a preferred embodiment of the case. A superconductive film 22 formed of, for example, neodymium-cerium-strontium-copper (NdCeSrCuO) is first deposited on a substrate 23. Next, a part of this film is removed to form a fine gap having a width d, by which two superconductive electrodes 22a and 22b are separated from each other. Next, a photo-conductive thin film 21 formed of PbSnTe doped with In to accomplish a high resistance is deposited to fill at least the gap between two superconductive electrodes 22a and 22b, so as to fabricate a functional superconductive photoelectric device. The gap width d is particularly chosen to be below 500 times of the coherence length of the superconductivity, in consideration that the extended coherence length of the superconductivity becomes continuous with each other excited by the light irradiation. For the case where PbSnTe is employed, the coherence length of the superconductivity in a dark state is approximately 30 angstrom. Therefore, the gap width d is chosen to be 0.5 μm. Electrode terminals (not shown in the figure) are provided to both the superconductive electrodes 22a and 22b, to which a constant current source is connected to measure the characteristics. The device of this configuration also exhibits the switching characteristic as well as the memory effect.

As an example of configurations, the structure shown in FIG. 8 is also effective. A photo-conductive film 31 formed of a compound semiconductor of lead chalcogenide is coated uniformly upon a substrate 33, over which the same superconductive film 32, as described above, is then formed. Next, a gap having the above-described width d is formed on a part of the superconductive film 32 so as to provide two superconductive electrodes 32a and 32b.

It is apparent that a protective insulation film transparent to the input light may be further provided upon the thus configurated device.

As described above, according to the present invention a functional device, operatable at a higher speed than the conventional switching devices and memory devices employing prior art electrical signals, is achieved. Therefore, a compact as well as high speed logic device is provided by combining the functional superconductive photoelectric device of the present invention with a light IC (integrated circuit). Moreover, its light-responding feature can be applied in a light detection apparatus handling an infrared light. More particularly, a device, accomplishing a characteristic that a normally conducting state is switched to a superconductive stated in response to a light irradiation according to the present invention, can constitute various high speed logic circuits by being combined with a conventional device having a logically contrary characteristic that the superconductive state is converted to a normally conducting state in response to a light irradiation.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not detailed to limit the invention and accordingly, all suitable modifications are equivalents may be resorted to, falling within the scope of the invention.

What I claim is:

1. A superconductive device, comprising:
   light irradiating means for irradiating a signal light;
   a pair of spaced electrodes; and
   photoelectric switch means for receiving the signal light from the light irradiating means and causing an absence of measurable resistance between the pair of spaced electrodes at a predetermined temperature when the signal light is received, the photoelectric switch means having a layer comprising first and second distinct materials, the first material being a compound semiconductor electrically connected to and disposed between said pair of spaced electrodes in an arrangement sufficient to receive light irradiation, the second material being grains of a metal doped in the compound semiconductor in a density distribution sufficient to cause said absence of measurable resistance.

2. A superconductive device according to claim 1, wherein said metal comprises a metal of a type sufficient to cause an absence of measurable resistance during a presence of light irradiation and a presence of measurable resistance during an absence of light irradiation.

3. A superconductive device according to claim 2, wherein said metal comprises Pb.

4. A superconductive device according to claim 1, wherein said metal comprises a metal of a type sufficient to create an absence of measurable resistance during and after a presence of light irradiation.

5. A superconductive device according to claim 4, wherein said metal comprises In.

6. A superconductive device according to claim 1, wherein said metal comprises a superconducting metal of a type sufficient to form superconductive grains in said compound semiconductor with a coherence length that expands in response to light irradiation.

7. A superconductive device according to claim 6, wherein said compound semiconductor comprises a photo-conductive ternary semiconductor.

8. A superconductive device according to claim 7, wherein said photo-conductive ternary semiconductor comprises one of $Pb_{1-x}Sn_xTe$, PbCdTe or PbSSe.

9. A superconductive device according to claim 8, wherein said superconducting metal is selected from the group consisting of Pb and In.

10. A superconductive device according to claim 6, wherein said superconducting metal is selected from the group consisting of Pb and In.

11. A superconductive device according to claim 1, wherein said compound semiconductor comprises a III-V compound semiconductor of high electrical resistance.

12. A superconductive device according to claim 11, wherein said III-V compound semiconductor comprises highly purified GaAs.

13. A superconductive device according to claim 11, wherein said III-V compound semiconductor comprises GaAs; and wherein said metal comprises Cr.

14. A superconductive device according to claim 11, wherein said III-V compound semiconductor comprises InP; and wherein said metal comprises Fe.

15. A superconductive device according to claim 1, wherein said compound semiconductor comprises a II-VI compound semiconductor of high electrical resistance.

16. A superconductive device according to claim 15, wherein said II-VI compound semiconductor comprises CdTe.

17. A superconductive device according to claim 15, wherein said II-VI compound semiconductor comprises HgCdTe.

18. A superconductive device according to claim 15, wherein said II-VI compound semiconductor comprises CdS.

19. A superconductive device according to claim 1, wherein said pair of electrodes comprise Au.

20. A photoelectric switch, comprising:
first electrode means for electrical conduction of current;
second electrode means for electrical conduction of the current; and
a layer comprising first and second distinct materials, the first material being semiconductor means for electrical semi-conduction of the current between said first electrode means and said second electrode means, the second material being variable length grain superconducting means for an immeasurable resistance electrical conduction of the current between said first electrode means and said second electrode means when exposed to light irradiation by an expansion and touching of a coherence length of superconductive grains, the variable length grain superconducting means being distributed within the semiconductor means.

21. A photoelectric switch according to claim 20, wherein said variable length grain superconducting means further performs said immeasurable resistance electrical conduction of current between said first electrode means and said second electrode means during exposure of electrical light irradiation and performs a measurable resistance conduction of current between said first electrode means and said second electrode means during an absence of light irradiation.

22. A photoconductive switch according to claim 20, wherein said variable length grain superconducting means further maintains said immeasurable resistance electrical conduction of current between said first electrode means and said second electrode means during and after exposure of light irradiation.

23. A superconductive device according to claim 1, wherein the first material is a lead chalcogenide and the second material is selected from a group consisting of lead and indium, the second material being excessively doped beyond stoichiometry in the first material to precipitate said grains of metal.

* * * * *